United States Patent
Ano

(10) Patent No.: US 6,815,836 B2
(45) Date of Patent: Nov. 9, 2004

(54) WIRE BONDING FOR THIN SEMICONDUCTOR PACKAGE

(75) Inventor: Kazuaki Ano, Hiji-machi (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/395,584

(22) Filed: Mar. 24, 2003

(65) Prior Publication Data

US 2004/0191954 A1 Sep. 30, 2004

(51) Int. Cl.[7] .............................................. H01L 23/48
(52) U.S. Cl. ........................ 257/784; 257/780; 257/686; 257/734; 438/617
(58) Field of Search ................................ 257/686, 734, 257/780, 784; 438/612, 617

(56) References Cited

U.S. PATENT DOCUMENTS 5,735,030 A * 4/1998 Orcutt .......................... 29/860
6,268,662 B1 * 7/2001 Test et al. .................... 257/784
2001/0002624 A1 * 6/2001 Khandros et al. ........... 174/250

* cited by examiner

Primary Examiner—Richard Elms
Assistant Examiner—Brad Smith
(74) Attorney, Agent, or Firm—Yingsheng Tung; Wade James Brady, III; Frederick J. Telecky, Jr.

(57) ABSTRACT

An assembly of a semiconductor chip (301) having an integrated circuit (IC) including at least one contact pad (320) on its surface (301a), wherein the contact pad has a metallization suitable for wire bonding, and an interconnect bonded to said contact pad. This interconnect includes a wire (304) attached to the pad by ball bonding (305), a loop (306) in the wire closed by bonding the wire to itself (307) near the ball, and a portion (307) of the remainder of the wire extended approximately parallel to the surface. The interconnect can be confined to a space (308) equal to or less than three ball heights from the surface.

7 Claims, 4 Drawing Sheets

WIRE BONDING FOR THIN SEMICONDUCTOR PACKAGE

FIELD OF THE INVENTION

The present invention is related in general to the field of semiconductor devices and more specifically to very thin wire-bonded semiconductor packages.

DESCRIPTION OF THE RELATED ART

An ongoing trend in the semiconductor industry is the need for devices with a thinner profile. One of the major hurdles to achieve thinner devices is an inherent feature of the wire ball-bonding technology, which is the dominant assembly technique for the majority of integrated circuit chips. In the wire ball-bonding process, a free air ball, approximately spherical in shape, is created at the tip of the wire by using a flame or a spark technique. It is unavoidable that the heat necessary to melt a small volume of the wire for forming the ball also spreads along a certain distance of the wire, without actually melting the metal. The extent of the heat-affected zone depends, among other parameters, on the thermal conductivity of the wire metal. Most commonly, gold, copper, aluminum, or alloys of these metals are used as wire materials. When the ball cools and solidifies, the cooling of the heat-affected zone causes a re-crystallization of the wire; a result of which is that the originally microcrystalline metal tends to develop fewer and larger crystals. These crystals, in turn, are easier to separate under force and thus reduce the mechanical strength of the wire in the heat-affected zone.

In the conventional ball-bonding technology, the reduction of mechanical strength in the heat-affected zone is compensated by a procedure in which the ball is first attached to the contact pad (for example, of the integrated circuit), and the wire is then allowed to attain a vertical position over the ball for the length of the heat-affected zone. Only after this vertical stretch is the wire formed into the curvature and bending of the loop which bridges the distance to the contact pad of the stitch bond. The usually high loop necessitated by the heat-affected zone is a hallmark of wire ball bonding. Would the curvature and bending of the wire initiate directly over the ball, the wire would easily shear off and break.

A need has therefore arisen for a coherent, low-cost method of wire ball bonding without the need of high, arching wire loops. The innovative wire bonding method should use the installed equipment base so that no investment in new manufacturing machines is needed. The method should be flexible enough to be applied for different semiconductor product families and a wide spectrum of design and assembly variations, and should achieve improvements toward the goals of improved process yields and device reliability.

SUMMARY OF THE INVENTION

One embodiment of the invention is an assembly of a semiconductor chip having an integrated circuit (IC) including at least one contact pad on its surface, wherein the contact pad has a metallization suitable for wire bonding, and an interconnect bonded to said contact pad. This interconnect includes a wire attached to the pad by ball bonding, a loop in the wire closed by bonding the wire to itself near the ball, and a portion of the remainder of the wire extended approximately parallel to the surface of the chip. The interconnect can be confined to a space equal to or less than about three ball heights from the surface.

In another embodiment of the invention, an electrically insulating substrate with first and second surfaces and a plurality of electrically conductive routing strips integral with the substrate, has a first plurality of contact pads disposed on the first surface and a second plurality of contact pads disposed on the second surface. An IC chip with a plurality of bonding pads is attached to the first substrate surface. At least some of the bonding pads have a wire interconnect attached by ball bonding. The interconnect has a loop in the wire which is closed by bonding the wire to itself near the ball, and a portion of the remainder of the wire extends approximately parallel to the surface, spanning the chip surface to the edge of the chip. Each interconnect can thus be confined to a space equal to or less than about three ball heights from the active surface. Finally, each wire is bonded to its respective substrate contact pad on the first substrate surface, and chip and wires are encapsulated. Interconnection elements may be attached to each of the contact pads on the second substrate surface.

Another embodiment of the invention is a method for forming a low profile wire bond for a low profile package for a semiconductor chip having on its surface an IC and at least one contact pad with a metallization suitable for wire bonding. In this method, a wire is attached to the pad by ball bonding. A loop is then formed in the wire and the loop is closed by stitching the wire to itself near said ball. As a result, the mechanical strength of the recrystallized portion of the wire near the ball is improved. The loop may be formed at a distance less than about three ball heights from the chip surface.

Embodiments of the present invention are related to thin devices and packages, which are, for example, required in stacks of memory devices and miniaturized products. The ICs for these and similar products can be found in many semiconductor device families such as standard linear and logic products, digital signal processors, microprocessors, wireless devices, and digital and analog devices. The embodiments apply to wires of various metals, such as gold, copper, or aluminum.

It is a technical advantage of one or more embodiments of the invention that the embodiments can reach the goals of the invention with a low-cost manufacturing method without the cost of equipment changes and new capital investment, by using the installed fabrication equipment base, especially established automated wire bonding machines.

Another advantage which may flow from one or more embodiments of the invention is to produce thin outline devices with packages having interconnection elements including reflowable material, or just with pressure contacts. Other embodiments of thin outline devices include packages with leadframes. Embodiments of the invention generally apply to semiconductor package types such as PDIPs, SOICs, QFPs, SSOPs, TQFPs, TSSOPs, TVSOPs, and Ball Grid Array devices employing leadframes.

The technical advances represented by certain embodiments of the invention will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The technical advances of the present invention can best be appreciated by a comparison with the shortcomings of the known technology.

Figure 1A:
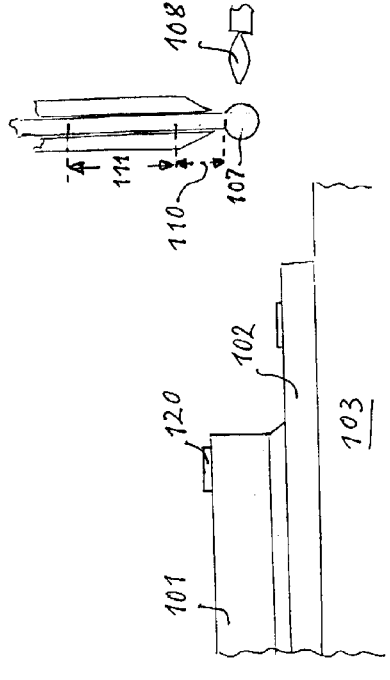
FIGS. 1A to 1D are schematic and simplified cross sections of a portion of a semiconductor chip and substrate on a hot stage in process steps of attaching a wire ball bond according to known technology.

As FIG. 1A schematically shows for known technology, the typical wire bonding process begins by positioning the semiconductor chip 101, attached to a substrate 102, on a heated pedestal 103 to raise the temperature to between 150 and 300° C. The wire 104 is strung through a capillary 105 and extends a short distance 106 outside the tip of the capillary. As an example, for a 25 urn diameter gold wire 104, the distance 106 may be 50 to 150 µm.

Figure 1C:
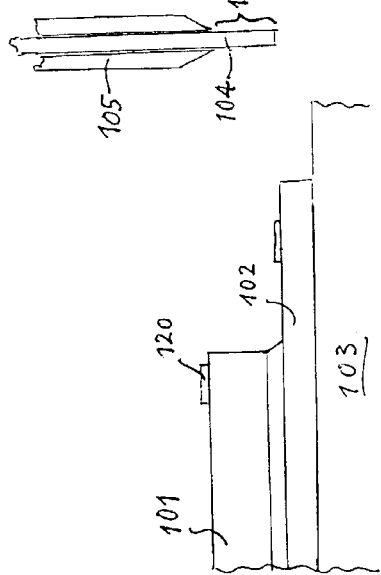
Figure 1B:
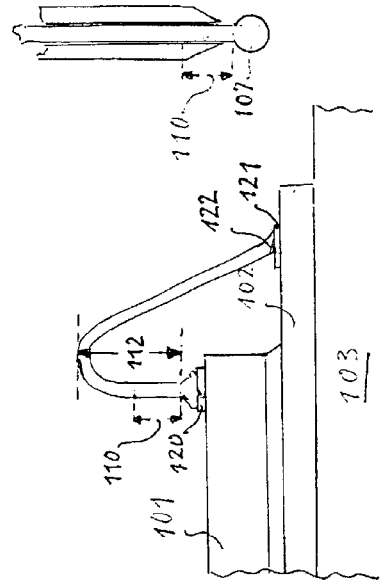
Figure 1D:
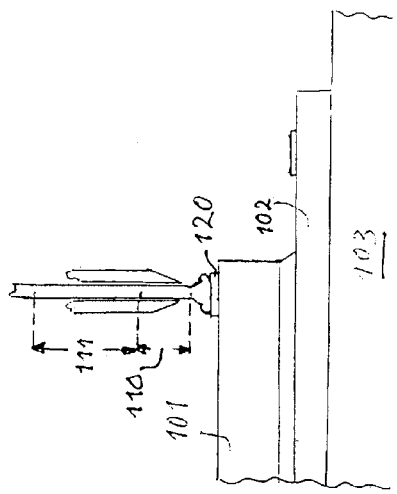

As illustrated in FIG. 1B, at the tip of the wire, a free air ball 107 is created using either a flame or a spark technique 108. The ball 107 has a typical diameter from about 1.2 to 4.0 wire diameters, and should preferably be outside of the capillary. Dependent on the thermal conductivity of the wire metal or alloy chosen, on the time of exposure to the flame or spark, and on other parameters such as the proximity of the capillary, heat extends a certain distance 110 from the air ball along the wire, without actually melting the wire but with enough temperature rise to affect the micro-crystallinity of the wire. As a rule of thumb, the extent of this "heat-affected zone" 110 has a length of about 1 to 1.5 free air ball diameters with significant re-crystallization, and sometimes an additional length 111 of up to 10 air ball diameters with minor re-crystallization.

Due to this re-crystallization, the mechanical strength of the wire for bending or pulling is considerably weakened, at least for the length of the heat-affected zone 110. For example, wire bending within the heat-affected zone may lead to premature wire breakage due to easy slipping along the macro-crystalline grain boundaries.

The capillary is moved towards the bonding pad 120, and the ball is pressed by the capillary against the metallization of the pad, as depicted in FIG. 1C. In this process, the ball is deformed; a typical shape looks like a "nailhead", but for the sake of convenience it is still referred to as the "ball" of the bond. After formation of the bond (often involving ultrasonic energy in addition to the compression force), the capillary has to be lifted straight upward in order to avoid wire bending at least for the length 110 of the heat-affected wire zone. Thereafter, the capillary moves in a pre-determined and computer-controlled manner through the air to create a wire arch of well defined shape, before the capillary attaches the wire by stitch bond 122 to the contact pad 121 of substrate 102. The height 112 of the wire arch is in principle required by the weak heat-affected zone 110.

Figure 1E:
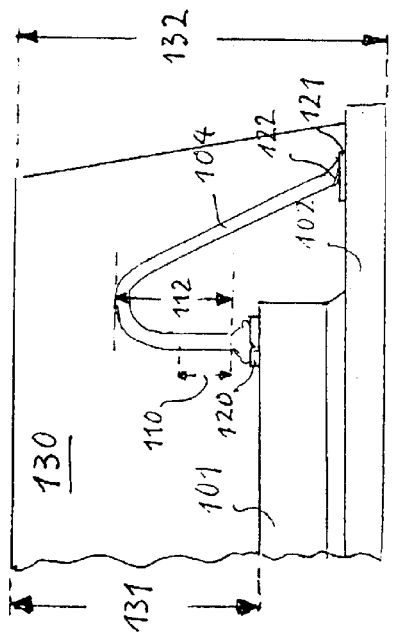
FIG. 1E shows a schematic cross section of a portion of a semiconductor chip, which is wire ball bonded, attached to a substrate and encapsulated, according to known technology.

In a later assembly step, indicated in FIG. 1E, chip 101 and wire 104 are protected by an encapsulation material 130. As FIG. 1E shows, a major portion 131 of the thickness 132 of the finished packaged device is determined by the height 112 of the wire arch inside the package. However, for the ongoing technology trend toward thinner semiconductor packages, height 132 is incompatible with the need of many electronic products, which require thinner packages.

Figure 2:
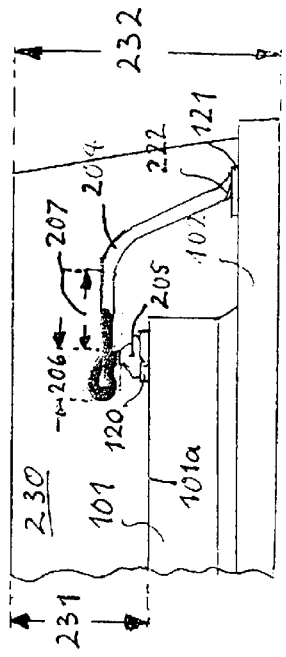
FIG. 2 illustrates a schematic cross section of a portion of a semiconductor chip, which is wire ball bonded according to the invention, attached to a substrate and- encapsulated.

The schematic FIG. 2 shows one embodiment of the invention, which solves the package thickness dilemma by eliminating the wire arch and the weakness of the heat-affected wire zone, which necessitated the arch in the first place. The thickness 232 of the finished packaged device is now only determined by the height portion 231, which is essentially a function of the encapsulation method (such as transfer molding).

Inside the package is a semiconductor chip 101, which has an integrated circuit including at least one contact pad 120 on its surface 101a having a metallization suitable for wire bonding. Examples for such metallization include aluminum, copper, gold, silver, palladium, or alloys thereof. Bonded to contact pad 120 is an interconnect which consists of a wire 204 attached to pad 120 by ball bonding 205. Examples for preferred wire materials include gold, copper, aluminum, and alloys thereof. Near "ball" 205 (deformed by pressing the capillary during the bonding process for instance into a nailhead shape) is a loop 206 in wire 204, which is closed by bonding the wire 204 to itself near ball 205. A portion 207 of the remainder of wire 204 is extended approximately parallel to chip surface 101a. The end of interconnect wire 204 is connected at bond 222 to contact pad 121 of substrate 102. For example, bond 222 may be a stitch bond. Preferred examples of contact pad materials are copper and gold-clad copper.

Figure 3:
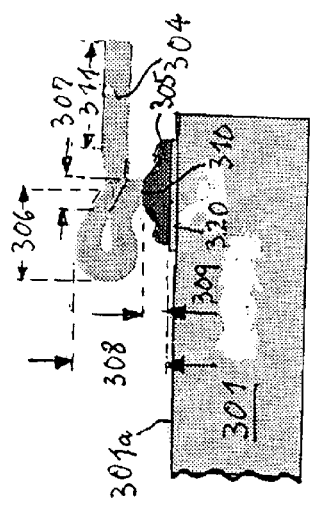
FIG. 3 is a schematic cross section of the wire ball bond interconnection scheme according to the invention.

In another embodiment of the present invention, schematically illustrated in FIG. 3, the interconnect is confined to a space 308 equal to or less than about three ball heights 309 from the IC surface 301a. The semiconductor chip 301 is shown with its surface 301a, including the IC and one contact pad 320. The contact pad 320 has a metallization suitable for wire bonding, such as aluminum,. copper, gold, or alloys thereof. The wire 304 consists preferably of gold, copper, aluminum, or alloys thereof.

The ball bond 305 of the interconnect is depicted in FIG. 3 as resembling a nailhead, metallurgically welded to bond pad 320. At its neck 310 with ball 305, wire 304 is strongly curved, directly in the heat-affected zone where the wire material re-crystallization is most pronounced. After forming loop 306, the loop is closed along a wire length 307 so that this length 307 is pressed as a stitch bond by the capillary directly in the curved wire portion in the heat-affected zone. As a result, the mechanical strength of the recrystallized portion of the wire next to the ball is reinforced. It should be stressed that the shape of the loop depicted in FIG. 3 is only one example of several possible wire shapes which provide the goal of reinforcing the mechanical strength of the heat-affected zone of ball bonds in order to enable interconnects in close proximity to the IC surface. A portion 311 of the remainder of wire 304 is extended approximately parallel to surface 301a.

In another embodiment of the present invention, a process for forming a low-rise wire loop is illustrated in the sequence of the schematic and simplified FIGS. 4A to 4F. In this sequence, the capillary of an automated bonder machine is moved by a computer-controlled program. Examples of commercially available computerized bonders are bonder 8020 by Kulicke & Soffa, Willow Grove, Pa., U.S.A., or ABACUS SA by Texas Instruments, Dallas, Tex., USA or a bonder by Shinkawa, Japan. Moving the capillary in a predetermined and computer-controlled manner through the air will create a wire looping of well defined shape.

Figure 4A:
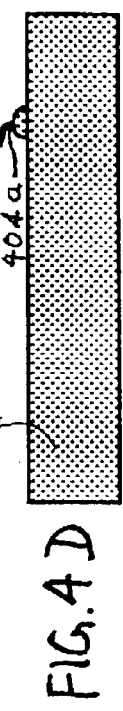
FIGS. 4A to 4F are schematic and simplified cross sections to describe process steps of the assembly method according to the invention.
Figure 4B:
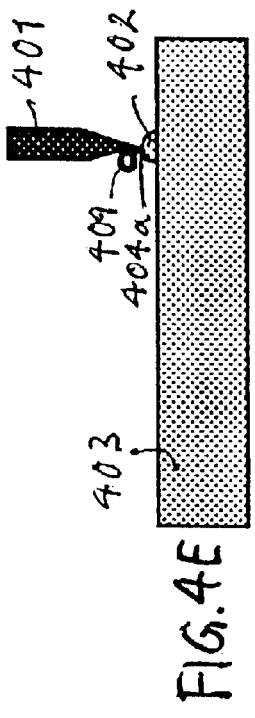
Figure 4C:
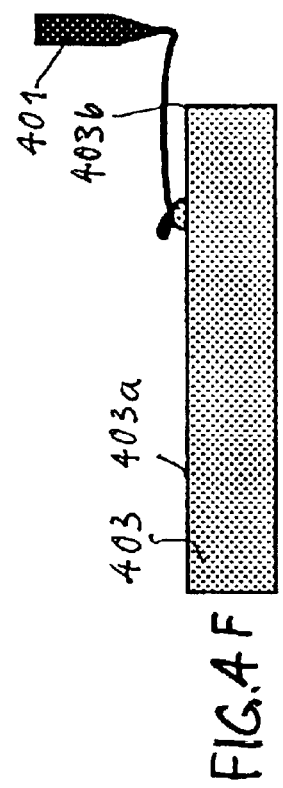
Figure 4D:
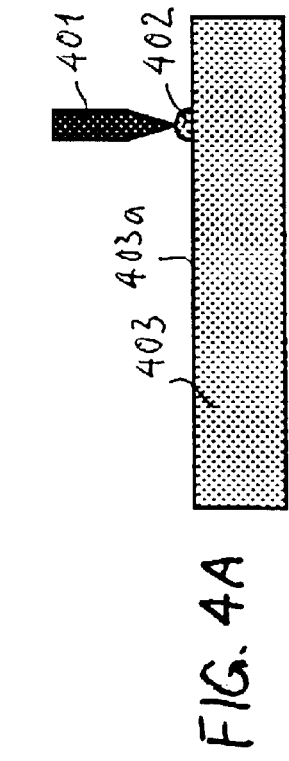
Figure 4E:
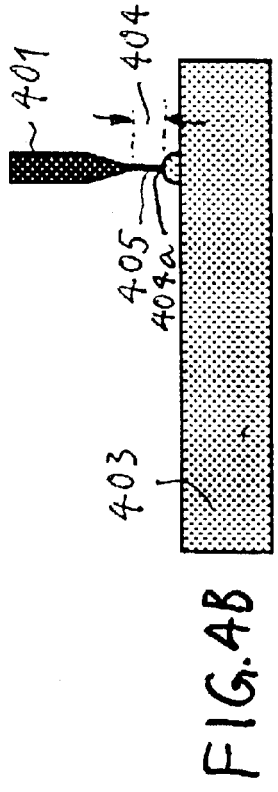
Figure 4F:
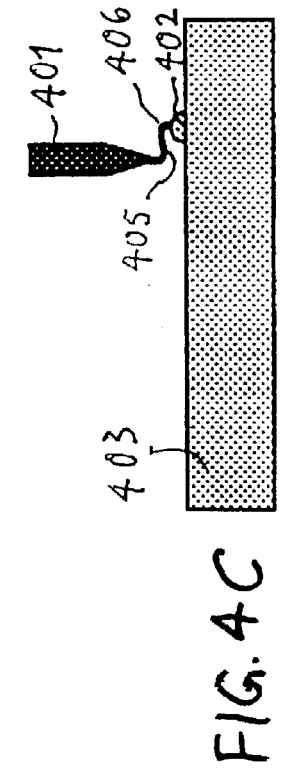

In FIG. 4A, the capillary 401 bonds the free air ball 402 to the bond pad of the IC on the surface 403a of the semiconductor chip 403. In FIG. 4B, capillary 401 rises and thus exposes a length 404 of wire 405, which contains the heat-affected zone beginning at neck 404a. In FIG. 4C, capillary 401 moves sidewise in one direction, bending wire 405 in the heat-affected zone near the ball 402 and extends the wire in the direction of movement. In FIG. 4D, capillary 401 slightly rises, bending the wire at position 407, and then reverses the sidewise movement into the opposite direction, extending the wire at position 408. In FIG. 4E, capillary 401 moves sidewise in the opposite direction until it is positioned vertically above neck 404a. Capillary 401 then moves toward ball 402, thus bonding the wire 405 to itself near the ball (as shown in detail in FIG. 3). This stitch bond closes the loop 409 and reinforces the heat-affected wire zone at wire neck 404a. In FIG. 4F, capillary 401 continues to move sidewise in the opposite direction, approximately parallel to the chip surface 403a and preferably at a distance equal to or less than about three ball heights from the surface 403a. This continued sidewise motion of the capillary spans at least the chip surface 403a until the edge 403b of the chip. Thereafter, the wire 405 may be attached to a contact pad on an external part such as a substrate.

Figure 5:
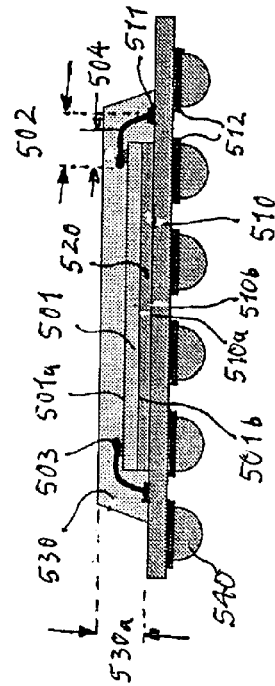
FIG. 5 illustrates the schematic cross section of an embodiment of the invention, showing a completed thin-outline ball grid array product having the low-rise ball bond interconnection according to the invention.

An example of a complete device assembly, including the assembly process flow in FIGS. 4A to 4F, is shown by another embodiment of the present invention, illustrated schematically in FIG. 5. A semiconductor chip 501 has an active surface 501a and a passive surface 501b. The active surface includes an IC and a plurality of contact pads with a metallization suitable for wire bonding. A ball bond interconnection 502, produced by the process flow described in FIGS. 4A to 4F, has been attached to each contact pad. Due to the loop 503 in the wire near each ball bond, the mechanical strength of the interconnection has been reinforced. A portion 504 of the interconnection 502 is extended approximately parallel to the surface 501a at a distance equal to or smaller than about three times the ball height.

Furthermore, the embodiment illustrated in FIG. 5 includes an electrically insulating substrate 510 having a first surface 510a and a second surface 510b. Substrate 510 includes a plurality of integral electrically conductive routing strips. A first plurality of contact pads 511 is disposed on the first surface 510a, and a second plurality of contact pads 512 is disposed on the second surface 510b. The passive chip surface 501b is attached to the first substrate surface 510a, using a chip attach material in layer 520.

The wire interconnections 502 are completed by extending the balance of the wires not used in portions 504 to stitch bonds onto substrate contact pads 511. Furthermore, chip 501 and the plurality of completed interconnections 502 are encapsulated by an encapsulation compound 530. A preferred material is an epoxy molding compound, applied in a transfer molding process. Due to the close proximity of the interconnections 502 to the chip surface 501a, the thickness 530a of the encapsulation compound can be kept at a profile as thin as the encapsulation technology allows. In the embodiment depicted in FIG. 5, an interconnection element 540 is attached to each contact pad 512 on the second surface 510b of the substrate 510. Examples for interconnection elements are bodies made of reflowable materials such as tin, indium, tin alloys including tin/indium, tin/silver, tin/bismuth, and tin/lead, conductive adhesives, and z-axis conductive materials.

In another embodiment of the present invention, the contact pads 512 on the second surface 510b of the substrate 510 are employed as pressure contacts to external parts.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor or compound material used in IC manufacturing.

Figure 7:
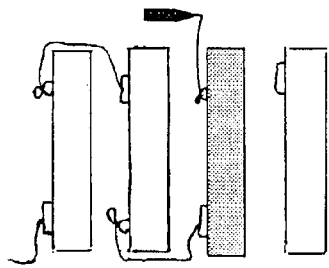
FIG. 7 is a schematic cross section of an embodiment of the invention, showing a stacked-chip product having chip interconnections according to the invention.
Figure 6:
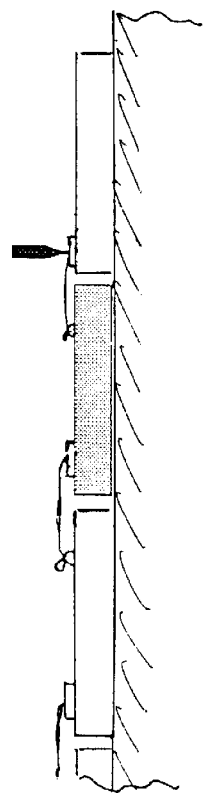
FIG. 6 is a schematic cross section of an embodiment of the invention, showing a multi-chip product having chip interconnections according to the invention.

As another example, the low-rise interconnection scheme including the wire loop reinforcing the strength of the recrystallized zone of the ball-bonded wire may be employed for interconnecting IC chips in a multi-chip product, as illustrated in the schematic cross section of FIG. 6, or in a stacked-chip product, as illustrated in the schematic cross section of FIG. 7.

Figure 8:
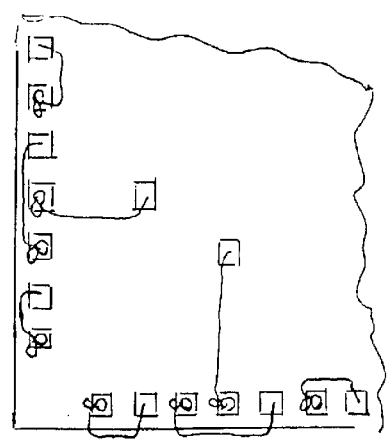
FIG. 8 is a schematic top view of an embodiment of the invention, showing bond pads of an IC interconnected according to the invention, as a substitute for an additional high power metallization level.

As another example, the low-rise interconnection scheme including the wire loop reinforcing the strength of the recrystallized zone of the ball-bonded wire may be used on the surface of a chip as a substitute for an additional metallization level in ICs, where regions requiring high power have to be interconnected. An example is shown in the schematic top view of FIG. 8.

It is therefore intended that the appended claims encompass any such modifications or embodiments.

I claim:

1. A semiconductor device assembly comprising:
   a semiconductor chip having an integrated circuit including at least one contact pad on its surface; and
   an interconnect bonded to said contact pad, said interconnect comprising a wire attached to said pad by ball bonding, a loop in said wire closed by bonding said wire to itself near said ball, and a portion of the remainder of said wire extended approximately parallel to said surface of said chip.

2. The device assembly according to claim 1 wherein said interconnect can be confined to a space equal to or less than about three ball heights from said surface.

3. The device assembly according to claim 1 wherein said wires are selected from a group consisting of gold, copper, aluminum, and alloys thereof.

4. A packaged semiconductor device assembly, comprising:
   a semiconductor chip having an active and a passive surface, said active surface including an integrated circuit and a plurality of bonding pads;

an electrically insulating substrate having first and second surfaces, a first plurality of contact pads disposed on said first surface and a second plurality of contact pads disposed on said second surface;

said passive chip surface attached to said first substrate surface;

an array of interconnects, each of said interconnects comprising a wire attached to a respective chip pad by ball bonding, a loop in said wire closed by bonding said wire to itself near said ball, and a portion of the remainder of said wire extending approximately parallel to said active surface, spanning said active surface to an edge of said chip;

each wire bonded to a corresponding substrate contact pad on said first substrate surface; and encapsulation covering said chip and said wires.

5. The assembly according to claim 4 further comprising interconnection elements attached to each of said contact pads on said second substrate surface.

6. The assembly according to claim 4 wherein said interconnection elements comprise reflowable material.

7. The assembly according to claim 4 wherein each of said interconnects can be confined to a space equal to or less than about three ball heights from said active surface.

* * * * *